United States Patent [19]

Huber et al.

[11] Patent Number: 4,528,518
[45] Date of Patent: Jul. 9, 1985

[54] CHAIN AMPLIFIER

[75] Inventors: Jakob Huber, Beyharting; Ewald Pettenpaul, Unterhaching, both of Fed. Rep. of Germany; Felix Petz, Somerset, N.J.

[73] Assignee: Siemens Aktiengesellschaft, Berlin and Munich, Fed. Rep. of Germany

[21] Appl. No.: 518,141

[22] Filed: Jul. 28, 1983

[30] Foreign Application Priority Data

Jul. 29, 1982 [DE] Fed. Rep. of Germany ....... 3228396

[51] Int. Cl.$^3$ ............................................. H03F 3/16
[52] U.S. Cl. .................................. 330/277; 330/310; 330/286
[58] Field of Search ................. 330/277, 286, 56, 307, 330/310

[56] References Cited

U.S. PATENT DOCUMENTS 4,295,225 10/1981 Pan ..................................... 330/277

Primary Examiner—James B. Mullins
Assistant Examiner—G. Wan
Attorney, Agent, or Firm—Herbert L. Lerner; Laurence A. Greenberg

[57] ABSTRACT

A chain amplifier assembly, includes a semiconductor body, a chain amplifier disposed in the semiconductor body and having an input, an output, a plurality of interconnected amplifier stages having transition regions therebetween, each of the stages including a plurality of field-effect transistors having source, gate and drain terminals, each of the source terminals being connected to a given common source potential, a plurality of ohmic resistors and inductances connected in series between the gate terminals forming a gate line, a plurality of capacitances each having a lead connected in parallel to the gate line and another lead connected to the given common source potential, a plurality of inductances connected in series between the drain terminals forming a drain line, a plurality of additional ohmic resistors having a lead connected in parallel to the drain line and another lead connected to the given common source potential, a plurality of additional capacitances having a lead connected in parallel to the drain line and another lead connected to the given common source potential, matching elements in the form of capacitances, inductances and ohmic resistors connected at the input, output and transition regions, the drain and gate lines being wave guides formed with metal coatings, insulating coatings and doping concentrations required for the field-effect transistors, and additional circuit elements monolithically integrated into the semiconductor body.

8 Claims, 4 Drawing Figures

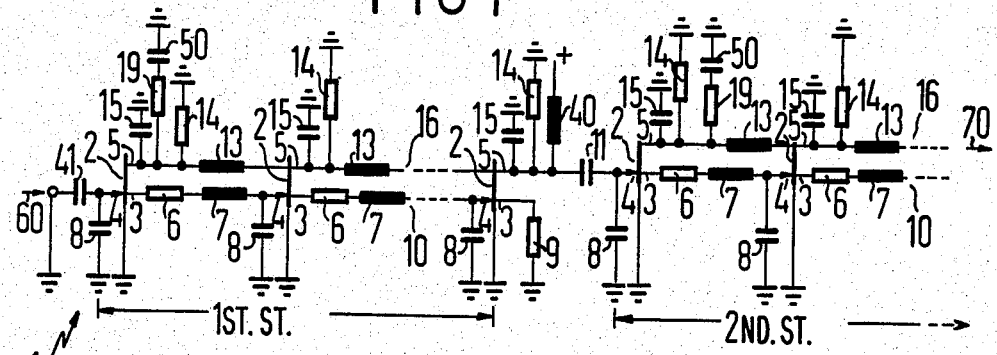
FIG 1
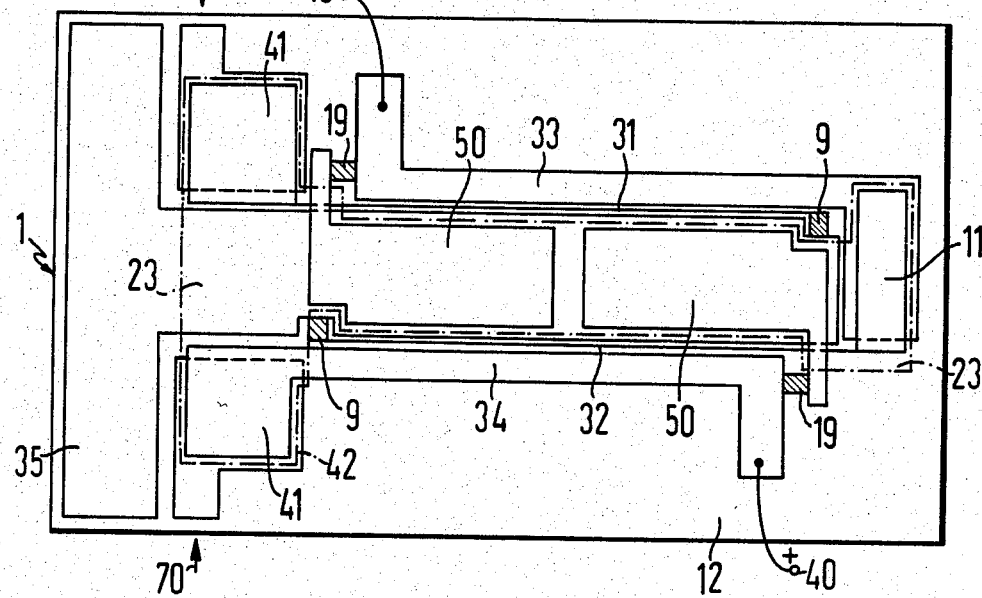
FIG 2
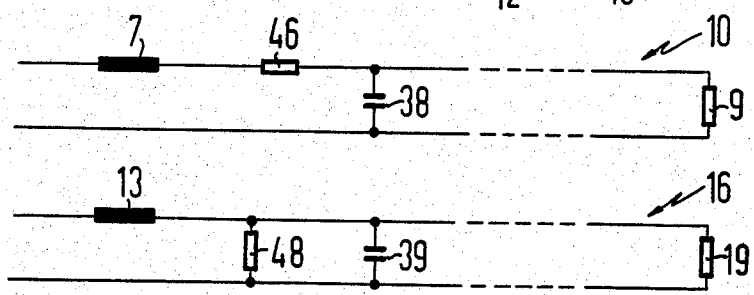
FIG 3
FIG 4

CHAIN AMPLIFIER

BACKGROUND

Prior Art

The invention relates to a chain amplifier including one or more amplifier stages, wherein each stage contains several field-effect transistors which are connected in such a way that all source terminals are at a given common potential, all gate terminals are connected together by means of series-connected ohmic resistors and inductances to form a gate line, and capacities or capacitances are disposed parallel to the gate line in such a manner that the leads of the capacitances which are not connected to the gate line are at the same respective source potential, all of the drain terminals are connected together by means of series-connected inductances to form a drain line, the drain line is connected on one hand, by means of ohmic resistors connected parallel to the drain line, to the common source potential, and on the other hand, the drain line is connected by means of capacitances, connected parallel to the drain line, to the common source potential, and capacitances, inductances and ohmic resistors are provided as matching elements at the input, output and at transitions from one stage to the next.

Such a single-stage chain amplifier is known in principle from the publication "International elektronische Rundschau", Vol 21, 1967, No. 5, Pages 109 to 115. The components required for the chain amplifier such as capacities or capacitances and inductances, however, are discrete components which are connected together with the transistors contained in the semiconductor chip, to form a chain amplifier. Furthermore, connecting discrete external components in an amplifier circuit is not sufficient in order to obtain amplifiers with extreme band width. If such amplifier circuits are to operate with output powers of 0.1 watt to 1 watt over a frequency range as wide as possible up to 18 GHz, the self-inductances, self-capacities and the inherent resistances of the connected field-effect transistors must also be taken into consideration.

SUMMARY OF THE INVENTION

It is accordingly an object of the invention to provide a chain amplifier which overcomes the hereinafore-mentioned disadvantages of the heretofore-known devices of this general type, for output powers of 0.1 watt to 1 watt, the band width of which is extremely large and the frequency range of which extends to 18 GHz.

With the foregoing and other objects in view there is provided, in accordance with the invention, a chain amplifier assembly, comprising a semiconductor body, a chain amplifier disposed in the semiconductor body and having an input, an output, at least one amplifier stage having transition regions therebetween, each of the stages including a plurality of field-effect transistors having source, gate and drain terminals, each of the source terminals being connected to a given common source potential, a plurality of ohmic resistors and inductances connected in series between all of the gate terminals forming a gate line, a plurality of capacitances each having a lead connected in parallel to the gate line and another lead connected to the given common source potential, a plurality of inductances connected in series between the drain terminals forming a drain line, a plurality of additional ohmic resistors having a lead connected in parallel to the drain line and another lead connected to the given common source potential, a plurality of additional capacitances having a lead connected in parallel to the drain line and another lead connected to the given common source potential, matching elements in the form of capacitances, inductances and ohmic resistors connected at the input, output and transition regions, the elements of the drain line and the gate line being constructed in such a way that the drain and gate lines function as wave guides which, for at least partial realization with suitable choice of materials and dimensions, are formed with all metal coatings, insulating coatings and doping concentrations required for producing the field-effect transistors, and additional required circuit elements monolithically integrated into the semiconductor body.

By providing inductances and capacities required for the circuit at least partially by self-capacities and inductances, the parasitic capacities and inductances can be utilized in an advantageous manner.

In accordance with another feature of the invention, the chain amplifier operates with an output power of from 0.1 to 1 watt over several octaves up to 18 GHz and especially 12 GHz. Such a chain amplifier has considerable advantages for microwave amplifiers. In particular, high gain, high linearity and high power as well as low noise figures result. Such a microwave amplifier seems to be an optimum compromise of all desired high-frequency amplifier properties.

In accordance with a further feature of the invention, the given common source potential is 0 volts. This is advantageous from a circuit design point of view.

For reasons of simplifying matching to the external leads, it is advantageous if, in accordance with an added feature of the invention, the chain amplifier has an input and output impedance of 50 ohms.

In accordance with an additional feature of the invention, there are provided ohmic resistors integrated in the semiconductor body and respectively connected to ends of the gate and drain lines, and integrated coupling capacitances connected between each respective gate line of a given amplifier stage and the drain line of the preceding amplifier stage.

In accordance with again another feature of the invention, the substrate is formed of gallium arsenide (GaAs).

In accordance with a concomitant feature of the invention, the field-effect transistors are Schottky contact field-effect transistors. The use of gallium arsenide as the substrate and Schottky contact field-effect transistors, have been found particularly advantageous for the purposes of this invention. However, other substrate materials such as indium phosphide or similar binary, ternary or quaternary compound semiconductors are entirely suitable as well.

Other features which are considered as characteristic for the invention are set forth in the appended claims.

Although the invention is illustrated and described herein as embodied in a chain amplifier, it is nevertheless not intended to be limited to the details shown, since various modifications and structural changes may be made therein without departing from the spirit of the invention and within the scope and range of equivalents of the claims.

BRIEF DESCRIPTION OF THE DRAWINGS

The construction and method of operation of the invention, however, together with additional objects and advantages thereof, will be best understood from the following description of specific embodiments when read in connection with the accompanying drawings, in which:

FIG. 1 is a schematic circuit diagram of an equivalent circuit for a two-stage amplifier according to the invention;

FIG. 2 is a diagrammatic top plan view of a chip surface which represents a construction of the equivalent circuit according to FIG. 1;

FIG. 3 is a circuit diagram of an equivalent circuit of the gate line; and

FIG. 4 is a circuit diagram of an equivalent circuit of the drain line.

DETAILED DESCRIPTION OF THE PREFERRED EMBODIMENTS

Referring now to the figures of the drawing and first particularly to FIG. 1 thereof, there is seen a chain amplifier 1 having a first stage and a second stage. Each stage is composed of a multiplicity of parallel-connected field-effect transistors 2 which correspond to a continuous subdivision of a single field-effect transistor formed of a source 35, a drain 33 and a gate 31 as seen in FIG. 2 (first stage) or formed of the source 35, a drain 34 and a gate 32 as seen in FIG. 2 (second stage). Each field-effect transistor 2 has a source terminal 3 and a gate terminal 4. Each of the source terminals 3 is at a common potential which, according to the embodiment example of FIG. 1, was chosen as ground potential. However, a potential other than ground potential can also be chosen as the common potential. Except for the inputs and outputs of each stage, the gate terminals 4 are connected to each other through series-connected ohmic resistors 6 and inductances 7. Capacities or capacitances 8 are respectively connected in parallel to the series-connected elements 6, 7 and one terminal of each is at the common source potential. The gate terminals 4 connected in this manner and a terminating resistor 9, together form a gate line 10. The gate line 10 is constructed in such a way that it is provided as a wave guide, as shown in FIG. 3, and can be formed, as shown in FIG. 2, by the gate contacts 31 and 32 as seen in FIG. 2 as well as the terminating resistors 9 and the common source 35. The drain terminals 5 of each field-effect transistor 2 are connected to each other by means of series-connected inductances 13. The first lead of an ohmic resistor 14 and a capacitance 15 are respectively shunted across the inductances 13 in such a manner that the second lead of the capacitance 15 and the ohmic resistor 14 are connected to the respective common source potential. The inductances 13, the ohmic resistors 14 and capacities or capacitances 15 are provided by the distributed inductances, ohmic resistances and capacitances of the drain contacts 33, 34 seen in FIG. 2. The inductances 13, the ohmic resistors 14, the capacitances 15, the drain contacts 33 and 34 of FIG. 2 and the terminating resistors 19, together form a drain line 16 (also see FIG. 4). The drain line 16 is likewise constructed like the gate line 10, in such a manner that it operates as a wave guide. The drain voltage is applied to the drain line 16 by means of external inductances 40 which may be provided with the proper choice of material, such as a bonding wire according to FIG. 2. If the source potential is chosen as ground potential, as shown in FIG. 1, then a positive drain voltage must be applied to the open end of the inductance 40, which is indicated by a small plus sign at that end. The capacitances 50 merely prevent the drain lines 16 from being directly connected to ground potential through the terminating resistors 19. The input 60 and the output 70, indicated by arrows, have input and output impedances of 50 ohms each.

FIG. 2 represents a practical construction of the equivalent circuit diagram according to FIG. 1. A chain amplifier 1 is incorporated in a substrate 12 which is formed of semiconductor material, particularly gallium arsenide. The substrate thickness is larger than or equal to 50 $\mu$m and preferably 100 $\mu$m. The drain contacts 33, 34 are preferably developed with the surface dimensions of 300 $\mu$m $\times$ 50 $\mu$m, and the gate contacts 31, 32 are preferably developed with surface dimensions of 300 $\mu$m $\times$ 1 $\mu$m on the substrate surface. In addition, the source contact 35 is deposited as a large area on the semiconductor surface. In order to form the gate contacts 31, 32, aluminum (Al) or layer sequences such as titanium, platinum, gold (TiPtAu); or chromium, gold, tungsten, gold (CrAuWAu), are preferably used. In order to make the drain contacts 33, 34 and the source contact 35, layer sequences of germanium, gold, chromium, gold (GeAuCrAu); germanium, gold, nickel (GeAuNi); or chromium, gold, tungsten, gold (CrAuWAu), are preferably applied and alloyed-in. The semiconductor substrate 12 is doped in a manner suitable for field-effect transistors under the metallized regions. The gate contact 31, the drain contact 33 and the source contact 35 are the main components of the first amplifier stage 1 indicated in FIG. 1 by means of arrows. In a similar manner, the gate contact 32, the drain contact 34 and the source contact 35 are the main components of the second amplifier stage 2, indicated by arrows in FIG. 1. The invention is not in any way limited to two-stage amplifiers, further stages can also be added in an analogous manner. In FIG. 2, the terminating resistors 9 for the gate line (also see FIG. 3 and FIG. 1) are furthermore shown as shaded areas in FIG. 2, which indicate suitable doping of these areas under the semiconductor surface. The terminating resistors 9 are constructed in such a way that they have an impedance of typically 20 ohms. In FIG. 1, the terminating resistor for the gate of the second stage is not shown but should be inserted into the second stage of FIG. 1 in a manner analogous to the circuit diagram of the first stage.

Further terminating resistors 19 function as drain terminating resistors and have a value of typically 55 ohms. The substrate doping of resistor 19 is also indicated by shading in FIG. 2. If gallium arsenide is used as the substrate, silicon (Si), sulfur (S), selenium (Se) and tellurium (Te) can be used as doping materials. In addition, a coupling capacitance 11 FIG. 1 is provided for coupling the first and second stages. Integrated capacitances 41 in FIG. 2 at the input and output of the chain amplifier serve for d-c-decoupling. Silicon nitride ($Si_3N_4$) is preferably used as the capacitor dielectric for the capacitances 11, 41, 50. The outlines of the deposited insulating layer, such as silicon nitride, are shown in FIG. 2 by a dot-dash line 42. The insulating layer furthermore serves at some points for insulation overlaying conductor areas or conductor or semiconductor surfaces. The coupling capacitances 11 and 41 are preferably 10 pF. The capacitances 50 are preferably 30 pF. These elements serve to prevent an ohmic connection between the drain contacts 33, 34 via the terminating resistor 19 with the common source potential. The inductances 40 are preferably 10 nH each. The input 60 and the output 70 of the structure are indicated by arrows having reference numerals 60 and 70, respectively.

FIGS. 3 and 4 contain equivalent diagrams for the gate line 10 and the drain line 16. The gate line and the drain line act as a microstrip wave-guide line. On one hand, the inductances are formed by the distributed inductances per gate length of the gate contacts 31, 32 and are typically 10 nH/cm. On the other hand, the inductances are formed by the distributed inductances per drain length of the drain contacts 33, 34 and are typically 2.7 nH/cm. The distributed capacitances per cm of line length are provided in the case of the gate line 10 by a gate-source capacitance 38 which is obtained as substantially the sum of the capacitances 8 shown in FIG. 1, and carries a typical value of 15 pF/cm. In the case of the drain line 16, the distributed capacitances are formed by a drain capacitance 39 which is obtained as substantially the sum of the distributed capacitances 15 of FIG. 1, and which carries a typical value of 1.7 pF/cm. In addition, the gate line 10 contains a distributed resistance 46 of about 1000 ohm per cm line length, while the drain line has a parallel-connected distributed transconductance 48 of typically 0.06 siemens (mho) per cm line length which corresponds to the circuit elements 14 of FIG. 1. The impedance of the gate line is $\sqrt{L/C} = 25$ ohms, and the impedance of the drain line is $\sqrt{L/C} = 40$ ohms.

The entire component is constructed in such a way that the input impedance is 50 ohms and the substrate thickness is chosen in such a way that it is as thin as technologically possible. The geometric length of the lines of the gate line and drain line corresponds approximately to the wave length W which is approximately 300 μm.

The energy transport takes place at the surface of the substrate. The parasitic capacitances against the rear side of the substrate, such as to ground, in particular, are relatively small and can therefore be neglected.

The chain amplifier according to the invention has the smallest possible quantizing of elements, i.e. a genuine distribution of the individual components. According to line theory, there are therefore theoretically no parasitic effects; the cutoff frequency can be increased distinctly. Besides a uniform gain characteristic, the principle allows optimum input and output matching, i.e. the amplifier can be constructed for a 50 ohm input and output impedance. Depending on the size of the transistors (gate width) and the number of stages of the amplifier, correspondingly high gain, linearity and power as well as low noise figures, are obtained. This type of amplifier would seem to represent the best possible compromise of all high frequency amplifier properties. The amplifier according to the invention operates for small and medium output powers of about 0.1 W to 1 W. It has a frequency range of at least one octave and operates up to a cutoff frequency of about 18 GHz.

Amplifiers according to the invention can advantageously be used for the microwave range, especially for TV satellites at frequencies of 4 GHz, 6 GHz, 8 GHz and 10 GHz and 12 GHz.

The foregoing is a description corresponding in substance to German Application No. P 32 28 396.2, dated July 29, 1982, the International priority of which is being claimed for the instant application, and which is hereby made part of this application. Any material discrepancies between the foregoing specification and the aforementioned corresponding German application are to be resolved in favor of the latter.

We claim:

1. Chain amplifier assembly, comprising a semiconductor body, a chain amplifier disposed in said semiconductor body and having an input, an output, a plurality of interconnected amplifier stages having transition regions therebetween, each of said stages including a plurality of field-effect transistors having source, gate and drain terminals, each of said source terminals being connected to a given common source potential, at least one ohmic resistor and at least one inductance connected in series between said gate terminals forming a gate line, a plurality of capacitances each having a lead connected to said gate line and another lead connected to the given common source potential, a plurality of inductances connected in series between said drain terminals forming a drain line, at least one additional ohmic resistor having a lead connected to said drain line and another lead connected to the given common source potential, a plurality of additional capacitances having a lead connected to said drain line and another lead connected to the given common source potential, matching elements in the form of capacitances, inductances and ohmic resistors connected at said input, output and transition regions, said drain and gate lines being wave guides formed at least partly with metal coatings, and insulating coatings and doping concentrations required for said field-effect transistors.

2. Chain amplifier assembly according to claim 1, wherein said chain amplifier operates with an output power of from 0.1 to 1 watt.

3. Chain amplifier assembly according to claim 2, wherein said chain amplifier operates with output power over several octaves up to 12 GHz.

4. Chain amplifier assembly according to claim 1, wherein the given common source potential is 0 volts.

5. Chain amplifier assembly according to claim 1, wherein said chain amplifier has an input and output impedance of 50 ohms.

6. Chain amplifier assembly according to claim 1, further comprising ohmic resistors integrated in said semiconductor body and respectively connected to ends of said gate and drain lines, and integrated coupling capacitances connected between each respective gate line of a given amplifier stage and the drain line of the preceding amplifier stage.

7. Chain amplifier assembly according to claim 1, wherein said substrate is formed of gallium arsenide.

8. Chain amplifier assembly according to claim 1, wherein said field effect transistors are Schottky contact field-effect transistors.

* * * * *